United States Patent [19]

Lincoln et al.

[11] 4,027,293
[45] May 31, 1977

[54] MICROCODE PROGRAM SEQUENCER

[75] Inventors: Neil R. Lincoln, St. Paul; David R. Resnick, Arden Hills, both of Minn.

[73] Assignee: Control Data Corporation, Minneapolis, Minn.

[22] Filed: Sept. 12, 1975

[21] Appl. No.: 612,837

[52] U.S. Cl. .......................................... 340/172.5
[51] Int. Cl.[2] ...................................... G06F 9/16
[58] Field of Search ............................. 340/172.5

[56] References Cited

UNITED STATES PATENTS

| | | | |
|---|---|---|---|
| 3,839,705 | 10/1974 | Davis et al. | 340/172.5 |
| 3,868,649 | 2/1975 | Sato et al. | 340/172.5 |
| 3,886,523 | 5/1975 | Ferguson et al. | 340/172.5 |
| 3,909,800 | 9/1975 | Recks et al. | 340/172.5 |
| 3,979,729 | 9/1976 | Eaton et al. | 340/172.5 |

*Primary Examiner*—Gareth D. Shaw
*Assistant Examiner*—C. T. Bartz
*Attorney, Agent, or Firm*—Robert M. Angus

[57] ABSTRACT

A microcode program sequencer includes first and second registers (herein designated the Q and P registers), each connected to a computer memory to receive addresses therefrom. Control means is provided for each register such that the P register will provide output addresses to a microcode memory, whereas the Q register(s) provide output addresses to the P register. By properly operating the control means, incrementing of addresses from the P register can be accomplished, as well as address jumps and returns, using the Q register. Further, the contents of the Q register may also be incremented in synchronism with the P register, as desired. One feature of the invention resides in a conditional latch circuit which may be selectively operated as a latch or as an OR gate.

13 Claims, 9 Drawing Figures

CLOCK

Q OUT CONTROL

Q SELECT

CARRY CONTROL

CONDITIONAL LATCH

MICROCODE PROGRAM SEQUENCER

This invention relates to computer processors, and particularly to a microcode program sequencer for controlling computer operations.

Microcode program sequencers are utilized in computers for controlling logic functions of a computer. For example, many computers utilize common circuitry capable of any of several functions which, when properly gated from a microde program memory, will perform a selected function. Heretofore, most microcode sequencers have been specifically designed for each computer and have been connected to a read-only memory (ROM) to receive addresses from the microcode memory, process those addresses and other control signals, and control the microcode memory to send appropriate enable signals to the various enable gates of the logic circuitry. Heretofore, due to the differences in hardwire configuration of various generations of computers, the difference in the bit length of words, and other significant differences, it has not been possible to construct a microcode program sequencer capable of functioning in any of several computers. Thus, microcode sequencers have heretofore been unique to a single type or model of computer. Further, due to the association of microcode program sequencers with a read-only microcode memory, the versatility of most prior microcode sequencers has been hindered, Since additional functions could not be written into the memory for use with the microcode sequencer. Instead, all processing to be accomplished by the microcode sequencer had to be inserted into the microcode memory as a design feature of the computer, and could not be altered in the field.

Prior microcode program sequencers utilized a single register for storage of the microcode address. As a result, such microcode program sequencers were limited in their capabilities to perform jump and return routines, as such routines, if performed, had to be performed elsewhere in the computer.

A microcode program sequencer according to the present invention comprises a plurality of registers, herein designated Q and P registers, with control circuits to control input to the registers. The control circuits receive inputs from the microcode memory to selectively operate the Q and P registers to receive branch addresses or other functions. By selectively conditioning the control circuits, new addresses may be read into any of the registers, addresses may be incremented for continuous operation, or jumps and other computer operations can be performed. The output of the registers is taken directly to the microcode memory for new addresses or for direct operation on the logic circuits of the computer.

One feature of the invention resides in the provision of hardware capable of controlling the P and Q register to selectively store and/or increment addresses so that the sequencer will provide one set of addresses from one register, while holding another address for future use. The address in the other register may be used for returns, jumps or other purposes, depending upon how the registers are selectively controlled.

Another feature of the present invention resides in the provision of a microcode program sequencer operable with a microcode memory capable of read and write functions so that additional instructions may be written into the microcode memory.

Another feature of the present invention resides in the provision of a highly versatile microcode program sequencer capable of functioning in a variety of computers, regardless of generation, configuration, speed or bit length of word.

With a microcode program sequencer according to the present invention, the size of the microcode memory may be minimized because subroutine techniques are possible within the microcode sequencer itself. The microcode program sequencer according to the present invention may be connected in a chained fashion to provide control for larger memories. Further, the sequencers may be connected in tandem to provide phased execution from independent memory elements, thereby increasing the apparent speed of the sequencer. Further, the provision of separate registers within the microcode program sequencer enables two dimensional decision processes to be accomplished.

The above and other features of this invention will be more fully understood for the following detailed description and the accompanying drawings in which.

Figure 1:
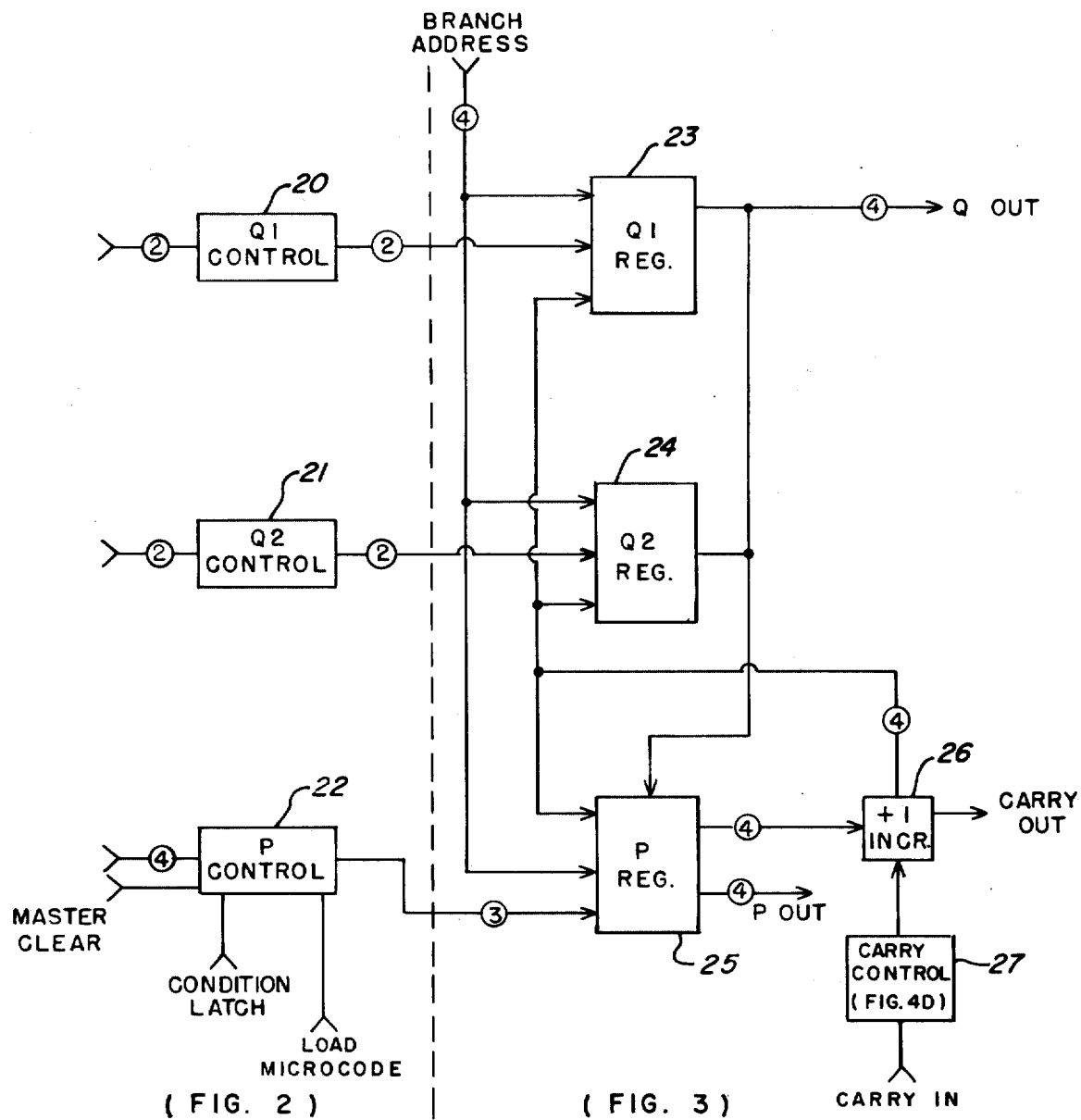
FIG. 1 is a block circuit diagram of a microcode program sequencer in accordance with the presently preferred embodiment of the present invention.
Figure 3A:
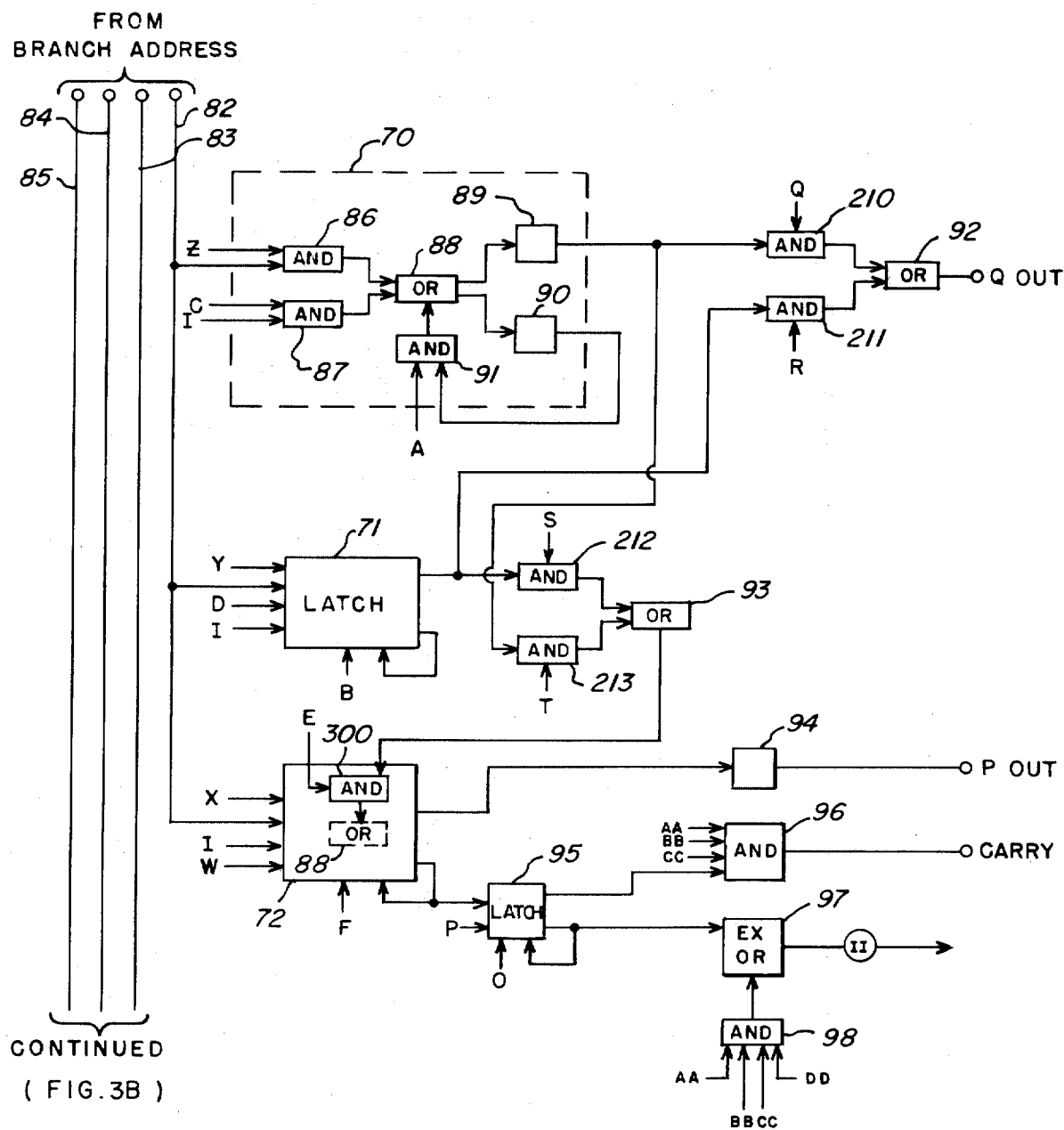
Figure 3B:
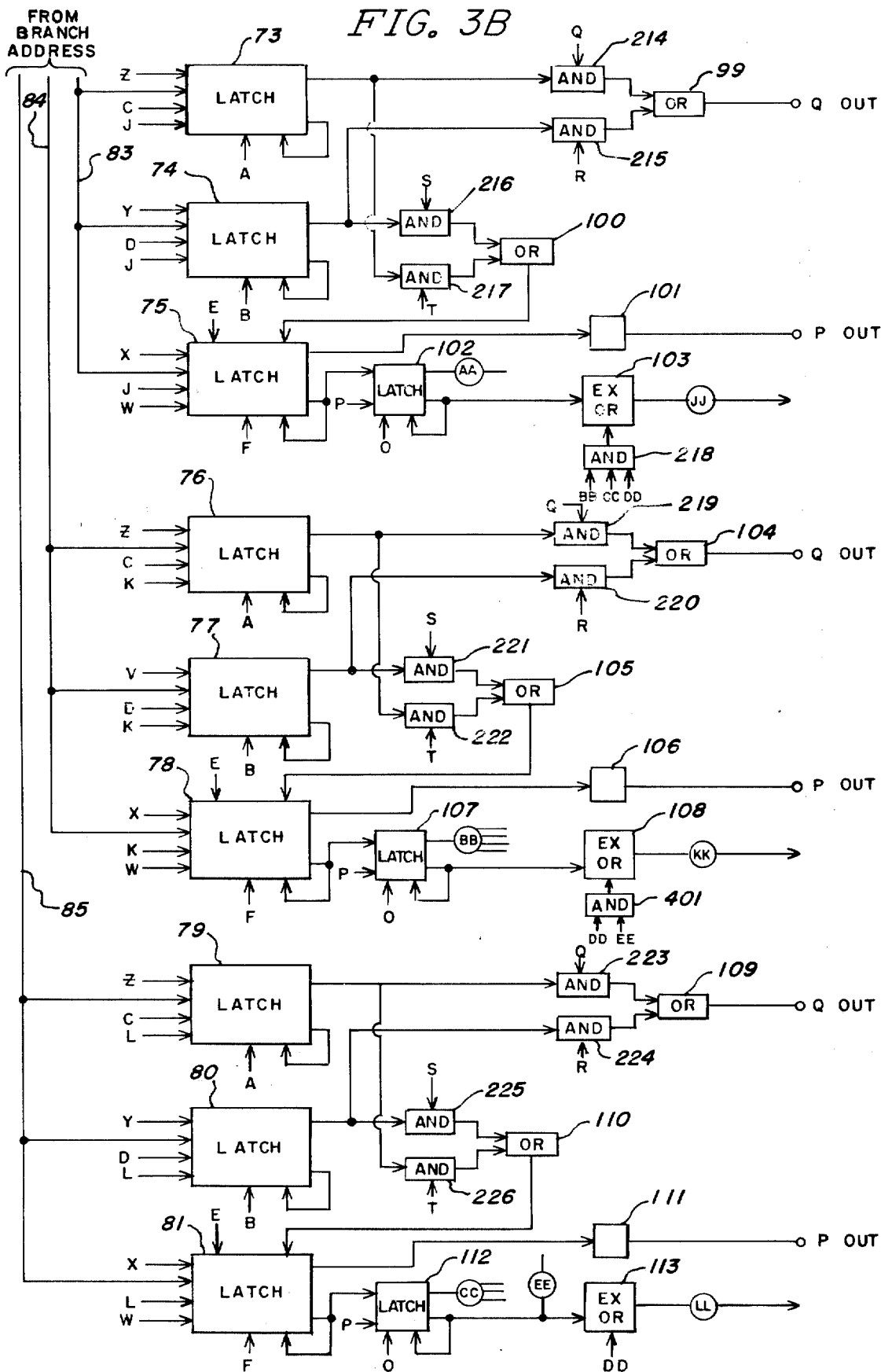
Figure 4A:
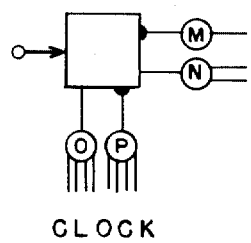
Figure 4B:
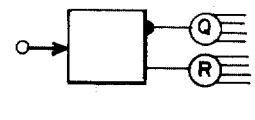
Figure 4C:
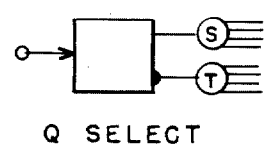
Figure 4D:
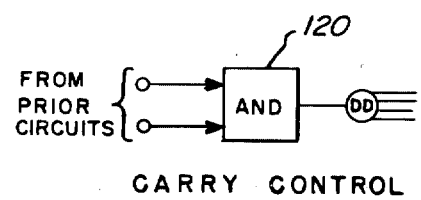
Figure 5:
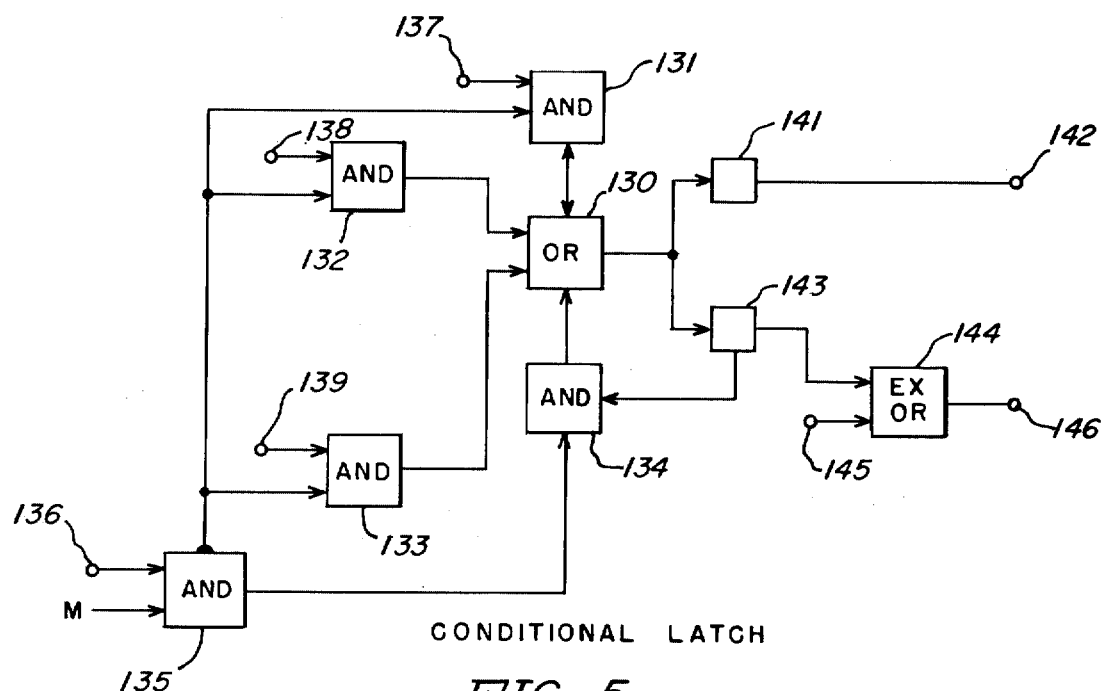

FIGS. 3A and 3B, taken together, are a block circuit diagram of the register and output control functions of the microcode program sequencer illustrated in FIG. 1;

FIGS. 4A through 4D are block circuit diagrams of certain control circuits utilized in the microcode program sequencer shown in FIG. 1; and FIG. 5 is a block circuit diagram of a conditional latch circuit useful with the microcode program sequencer according to the present invention.

With reference to FIG. 1, there is illustrated a block circuit diagram of a microcode program sequencer in accordance with the presently preferred embodiment of the present invention. The microcode sequencer comprises a Q1 control circuit 20, a Q2 control circuit 21 and a P control circuit 22. Circuits 20 and 21 each receive 2 bits of input from a microcode memory, whereas control circuit 22 receives a 4-bit input from microcode memory. In addition, conditional latch, load microcode enable, and master clear signals may be provided to the P control circuit. Q1 register 23 receives inputs from the branch address portion of the microcode memory, increment circuit 26 and the Q1 control circuit 20. Q1 register 23 provides an output to P register 25. Q2 register 24 receives inputs from the Q2 control circuit 21, increment circuit 26 and the branch address of the microcode memory, and provides an output to P register 25. Additionally Q1 and Q2 registers 23 and 24 may also provide another output (designated Q out) for test and control purposes. P register 25 receives inputs from the P control circuit 22, the branch address of the microcode memory, increment circuit 26 and the Q1 and Q2 registers directly. P register 25 provides an output directly to the microcode memory as well as to plus one increment circuit 26, which in turn provides outputs to each of the registers 23, 24 and 25. Increment circuit 26 further provides a Carry output to further microcode sequencer circuits as will be more fully explained hereinafter. Several microcode sequencer circuits illustrated in FIG. 1 may be arranged in a chained fashion, in which case a carry output will be forwarded from one microcode sequencer to the next, particularly through the carry control circuit 27 associated with the plus one increment circuit 26.

Figure 2:
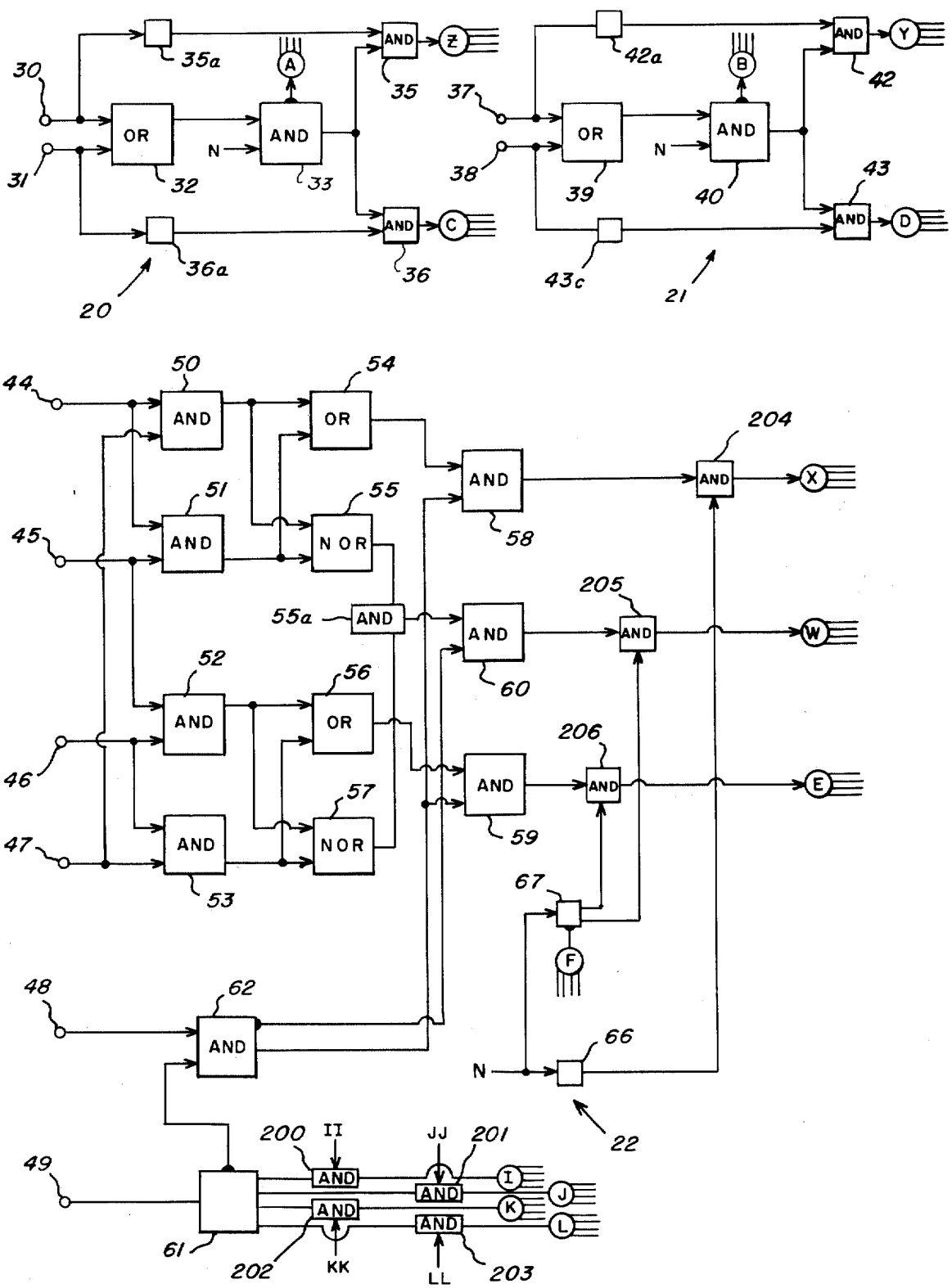
FIG. 2 is a block circuit diagram of the control functions of the microcode program sequencer illustrated in FIG. 1.

FIGS. 2-4 illustrate a more detailed block circuit diagram of the microcode program sequencer illustrated in FIG. 1. Referring particularly to FIG. 2, which illustrates the control circuits 20, 21 and 22, the Q1 control circuit 20 is illustrated in the upper left-hand portion of FIG. 2, Q2 control circuit 21, which is substantially the same as the Q1 control circuit 20, is shown in the upper right-hand portion of FIG. 2, and the remainder of the Figure is essentially devoted to the P control circuit 22.

The Q1 control circuit includes a pair of inputs 30, 31 connected to OR gate 32. OR gate 32 is connected to AND gate 33 which in turns provide an output to circuits 35 and 36 and an inverted output to conductors A. AND gates 35 and 36 provide outputs to conductors Z and C, respectively. Drive circuit 35a provides a second input between input 30 and AND gate 35, while drive circuit 36a provides a second input between input 31 and AND gate 36. The Q2 control circuit includes input terminals 37 and 38 connected to OR gate 39 which in turn provides an output to AND gate 40. AND gate 40 provides an inverted output to the conductors B and an output to AND gates 42 and 43. Drive circuit 42a provides direct connection between terminal 37 and AND gate 42 while drive circuit 43a provides connection between terminal 38 and AND gate 43. AND gates 42 and 43 provide outputs to conductors Y and D, respectively. The second inputs of AND gates 33 and 40 are connected to conductor N to receive clock pulses.

The P control circuit has input terminals 44, 45, 46, 47, 48 and 49. Input terminal 44 is connected as a first input to AND gates 50 and 51, input terminal 45 is connected to AND gates 51 and 52, input terminal 46 is connected to AND gates 52 and 53, and input terminal 47 is connected to AND gates 50 and 53. The outputs from AND gates 50 and 51 are connected separate inputs to OR gate 54 and to NOR gate 55 while the outputs of gates 52 and 53 are connected as separate inputs to OR gate 56 and NOR gate 57. The output from OR gate 54 is connected to a first input of AND gate 58, the output of OR gate 56 is connected to a first input of AND gate 59, and the outputs from NOR gates 55 and 57 are connected through AND gate 55a to one input of OR gate 60.

Terminal 49 is connected to drive circuit 61 which provides inputs to AND gates 200, 201, 202 and 203 and an inverted output to one input of AND gate 62. The other input of AND gate 62 is connected to terminal 48. AND gate 62 provides one output to a second input of AND gates 58 and 59, and an inverted output to a second input of OR gate 60. AND gate 58 provides an output to AND gate 204; OR gate 60 provides an output to AND gate 205; and AND gate 59 provides an output to AND gate 206. Conductor N provides inputs to drive circuits 66 and 67; drive circuit 67 providing an output to AND gates 205 and 206 and an inverted output to conductor F while drive circuit 66 provides output to AND gate 204.

AND gates 204, 205 and 206 provide outputs to the X, W and E conductors respectively. AND gate 200 receives a second input from conductor II; gate 201 receives a second input from conductor JJ, gate 202 receives a second input from conductor KK and gate 203 receives a second input from conductor LL. Gates 200, 201, 202 and 203 provide outputs to the I, J, K and L conductors respectively.

FIG. 3 illustrates the register, carry and increment portions of the microcode program sequencer illustrated in FIG. 1. As shown in FIG. 3 a plurality of latch circuits 70-81 are provided to receive branch addresses via connectors 82, 83, 84 and 85 from the branch address portion of the microcode memory. The details of latch circuit 70 are illustrated in FIG. 3, and is understood that the other latch circuits have essentially the same type of circuitry, with differences as noted hereinafter.

Latch circuit 70 includes an AND gate 86 connected to receive inputs from the Z conductor and from the branch address via connector 82. AND gate 87 is connected to receive inputs from the C and I conductors. AND gates 86 and 87 provide inputs to OR gate 88 which in turn provides outputs to drive circuits 89 and 90. The output from drive circuit 90 is provided as one input to AND gate 91 which in turn provides an input to OR gate 88. The second input for AND gate 91 is provided via conductor A.

Conductor 82 from the branch address is connected as an input to latch circuits 70, 71 and 72, conductor 83 is connected as an input to latch circuits 73, 74 and 75, conductor 84 is connected as an input to latch circuit 76, 77 and 78, and conductor 85 is connected as an input to latch circuits 79, 80 and 81. Latch circuit 71 also receives inputs from conductors B, D, I and Y, while latch circuit 72 receives inputs from conductors F, I, X and W. Latch circuit 73 receives inputs from conductors A, C, J and Z, latch circuit 74 receives inputs from conductors B, D, J and Y, while latch circuit 75 receives inputs from conductors F, J, W and X. Latch circuit 76 receives inputs from conductors A, C, K and Z, latch circuit 77 receives inputs from conductors B, D, K and Y, while latch circuit 78 receives inputs from conductors F, K, W and X. Latch circuit 79 receives inputs from conductors A, C, L and Z, latch circuit 80 receives inputs from conductors B, D, L, and Y, while latch circuit 81 receives inputs from conductors F, L, W and X.

Latch circuit 70 provides inputs to AND gates 210 and 213 while latch circuit 71 provides inputs to AND gates 211 and 212. AND gates 210 and 211 provide outputs to OR gate 92, while AND gates 212 and 213 provide outputs to OR gate 93. AND gate 210 receives a second input from conductor Q, AND gate 211 receives a second input from conductor R, AND gate 212 receive a second input from conductor S and AND gate 213 receives a second input from conductor T. OR gate 92 provides an output to Q out, which is one bit line for the Q output shown in FIG. 1. OR gate 93 provides an input to latch circuit 72.

As shown in the drawings, and particularly in connection with latch circuit 72, latch circuits 72, 75, 78 and 81 each include an additional AND gate 300 each connected to receive inputs from the E conductor and from an OR gate (such as OR gate 93) associated with a prior latch circuit. The circuit associated with these four latch circuits is essentially the same as that shown in connection with latch circuit 70, the difference being that the inputs from the E conductor and the prior OR circuit 93 are connected to AND gate 300 which in turn provides an output to the OR gate shown as OR gate 88 in latch circuit 72. Latch circuit 72 provides an output through drive circuit 94 to P out, which is the first bit line of the output for the P register. Latch circuit 72 also provides an output to latch circuit 95 which in turn provides outputs to AND gate 96 and to EXCLUSIVE OR gate 97. AND gate 96 receives inputs from latch circuit 95, and from conductors AA, BB and CC which in turn are connected to the output of latch circuits 102, 107 and 112. AND gate 96 provides an output to Carry Out, for purposes to be hereinafter explained. AND gate 98 receives inputs from conductors AA, BB, CC, and DD and provides an output to EXCLUSIVE OR gate 97. EXCLUSIVE OR gate 97 provides an output to conductor II (for feeding back to AND gate 200 (FIG. 2) to enable inputs to latch circuits 70, 71 and 72 on conductor I).

Similarly, latch circuits 73 and 74 provide outputs to AND gates 214, 215, 216 and 217 to operate OR gates 99 and 100; AND gates 214 and 215 further receiving inputs from conductors Q and R respectively to operate OR gate 99 to provide and output to a second bit line of Q out. AND gate 216 and 217 receive further inputs from conductors S and T, respectively, to control OR gate 100 to provide an input to latch circuit 75. Latch circuit 75 provides an output through drive circuit 101 for a second bit line of P out. In addition, latch circuit 75 provides output to latch circuit 102 which in turn provides an output for conductor AA and to EXCLUSIVE OR gate 103. EXCLUSIVE OR gate 103 receives a further input from AND gate 218 which receives inputs from conductors DD, BB and CC. Gate 103 provides an output to conductor JJ for feeding back to AND gate 201 to enable to latch circuits 73, 74 and 75 via conductor J.

Latch circuits 76 and 77 provide outputs to AND gates 219, 220, 221 and 222 to enable OR gate 104 and 105; AND gates 219 and 220 receiving further inputs from conductors Q and R to control OR gates 104 to provide an output for a third bit line of Q out, and AND gates 221 and 222 receiving further inputs from the S and T conductors and providing outputs to OR gate 105 to provide an output to latch circuit 78. Latch circuit 78 provides an output through drive circuit 106 to a third bit line of P out, and provides an output to latch circit 107. Latch circuit 107 provides outputs to conductors BB and to EXCLUSIVE OR circuit 108. EXCLUSIVE OR circuit 108 receives an input from circuit 401 and provides an output to conductor KK for feeding back to AND gate 102 to enable latch circuits, 76, 77 and 78 via conductor K. AND gate 401 receives an input from conductors DD and EE.

Latch circuits 79 and 80 provides to AND gates 223, 224, 225 and 226 to enable OR gates 109 and 110; AND gates 223 and 224 receiving further inputs from the Q and R conductors to control OR gate 109 to provide a fourth bit line of Q out, and AND gates 225 and 226 receiving further inputs from conductors S and T to control OR gates 110 to provide an output to latch circuit 81. Latch circuit 81 provides an output through drive circuit 111 to the fourth bit line of P out, and provides an output to latch circuit 112. Latch circuit 112 provides outputs to conductors CC, EE and EXCLUSIVE OR gate 113. Exclusive OR gate 113 receives a second input from conductor DD and provides an output to conductor LL to enable AND gate 203 to provide a signal via conductor L for latch circuits 79, 80 and 81.

As shown in FIG. 3, each of latch circuits 95, 102, 106 and 112 receive inputs from the O and P conductors, which are essentially clock inputs. (See FIG. 4A).

It will be appreciated that OR gates 92, 99, 104 and 109 pass a signal to the respective Q out bit line when a signal is present from one (or both) of the inputing latch circuits and a corresponding signal appears on a respective one of conductors Q or R. Thus, OR gate 92 provides a Q out signal when a signal is provided from latch circuit 70 and on the Q conductor or when a signal is provided from latch circuit 71 and from the R conductor. Similarly, OR gate 93, 100, 105 and 110 provide outputs on a conditional basis when one or the other of the inputing latch circuits provides a signal and a corresponding S or T conductors also provide a signal. Thus, OR gate 93 provides an output when a signal is present from latch circuit 70 and also conductor T or when signal is present from latch circuit 71 and also on conductor S.

As shown in FIGS. 4A, 4B and 4C, the clock associated with the microcode processor provides outputs on conductors N and O and inverted outputs on conductors M and P, a Q out control circuit (FIG. 4B) provides an output on conductor R and and inverted output on conductor Q, and a Q select control (FIG. 4C) provides an output on conductor S and an inverted output on conductor T. Also, as shown in FIG. 4D, a carry control is provided and consists of an AND gate 120 having input terminals connected to prior microcode sequencers. As will be more fully understood hereinafter, several microcode sequencers, as illustrated in FIG. 1, may be provided to operate in a chained fashion. In such an event, the carry out signal from gate 96 (FIG. 3) will be connected as an input to AND gate 120 so that if all of the lower-ordered microcode sequencers provide a carry output, AND gate 120 will be operated to provide a signal on conductors DD. It will be evident to those skilled in the art that when a plurality of sequencers are arranged in a chained fashion, conductor DD of the lowest-ordered sequencer will be tied to a permanent source of binary 1 signals, the next higher ordered sequencer will have its conductor DD connected to the carry output conductor from gate 96 of the lowest-ordered sequencer, and the higher-ordered sequencer will have its DD conductor connected to the output of AND gate 120 (FIG. 4D) whose inputs are connected to the carry outputs of the all lower-ordered sequencers.

It will be appreciated that latch circuits 70, 73, 76 and 79 comprise the Q1 register, that latch circuits 71, 74, 77 and 80 comprise the Q2 register and that latch circuits 72, 75, 78 and 81 comprise the P register.

In operation of the apparatus as thus far described, assume it is desired to load data into the Q2 register from the address field of the microcode memory. The four bits of data is applied to lines 82 through 85 and hence to latch circuits 71, 74, 77 and 80. The Q2 control is enabled via terminal 37 to supply outputs on the Y conductors and an inverted output on the B conductors to operate the latch circuits associated with the Q2 register. The data is then loaded into the register during a clock pulse. Upon removal of the signal from terminal 37, the output of AND gate 40 is inverted so that an enable signal is provided via conductors B to the latch circuits to store the data in the latch. In the respect, the signal on conductor B and the output of OR gate 88 through drive circuit 90 serve to operate AND gate 91 to maintain the output from OR gate 88 after inversion of the signal on conductor Y. Assuming it is desirable to transfer that information from the Q2 register to the P register, the Q select circuit (FIG. 4C) is operated to provide outputs on the S conductors to enable AND gates 212, 216, 221 and 225 to pass the information through OR gates 93, 100, 105 and 110 to AND gate 300 of latch circuits 72, 75, 78 and 81. Simultaneously the P control circuit provides enable signals over the E conductors to the AND gates 300 of latch circuits of the P register to enable the latch circuits to receive the data from the Q2 register. (The signals on the E conductors will occur during a clock cycle whenever signals to terminals 45 and 46 or to terminals 46 and 47 are binary 1s. Normally signal to terminals 45 and 46 come from microcode memory and the signal on terminal 47 comes from conditional latch circuit (FIG. 5).

The data can be read out through the P out terminals of the P register to the microcode memory as memory addresses to select instructions for direct operation of the computer logic. If it is desirable to run a continuous increment of the addresses, enable and data signals can be provided through latch circuits 95, 102, 107 and 110 to EXCLUSIVE OR circuits 97, 103, 108 and 113 to provide outputs on the I conductors back to the latch circuits of the P register to continuously increment the address. At the same time, the latch circuits associated with the Q2 register may be incremented if the Q2 control circuit provides outputs on the D conductor. Otherwise, the Q2 register may hold the original data from the branch address for a future return. While addresses are being issued from the P register, it may be desirable to load a future address into the Q1 or Q2 register, which can be accomplished from the branch address and proper enabling of the latch circuits in a manner similar to that described for the Q2 latch circuits.

In an increment mode, each EXCLUSIVE OR gate 97, 103, 108 and 113 will pass the signal received from the respective latch circuit, or an inversion of it, depending upon the conditions of other signals into the respective EXCLUSIVE OR gate. For exmaple, assume latch circuit 78 and 81 (the two least significant bit positions of the P register) each contain a binary 1, while latch circuit 75 (the third least significant bit position of the P register) contains a binary 0. If the bit positions of the sequencer are the very lowest of any chained arrangement of sequencers (which is presently assumed for purpose of description), conductors DD will be permanently tied to a source of binary 1 signal. Prior to the first clock pulse (after the clock pulse causing loading of the signals into the P register), the signals stored in latch circuits 75, 78 and 81 are transferred to latch circuits 102, 107 and 112. This transfer is accomplished between clock pulse due to the presence of a binary 1 on the P conductor from the clock (see FIG. 4A). Latch circuits 112 and 107 provide binary 1 outputs, while latch circuit 102 provides a binary 0 output. As a result, binary 1 signals are provided to EXCLUSIVE OR gates 108 and 113 by latch circuits 107 and 112. Also, binary 1 signals are provided on conductors BB, CC and EE. The binary 1 signal on conductor EE, together with the binary 1 already on conductor DD, causes EXCLUSIVE OR gate 108 to invert the signal, causing a 0 output on conductor KK. Further, the binary 1 input to gate 113 will produce an inverted output due to the presence of a binary 1 on conductor DD, thereby providing a 0 output on conductor LL. Further the binary 1 signals on both conductors BB and CC together with the binary 1 on conductor DD operate AND gate 218 to invert the 0 input from latch circuit 102 in EXCLU-SIVE OR gate 103, thereby providing a binary 1 output on conductor JJ.

The binary 0s appearing on conductors KK and LL, when applied to AND gates 202 and 203, cause a 0 signal to be applied via conductors K and L to latch circuits 78 and 81, so that during the next clock pulse these latches will be set to 0. The binary 1 on conductor JJ, when applied through AND gate 201, causes a 1 to be applied via conductor J to latch circuit 75, so that during the next clock pulse the latch will be set to 1.

It is evident that after the latches are set to 100, (stepped up from the 011 initial code), that code is transferred into latches 102, 107 and 112 so that the 1 signal on conductors BB, CC and EE are reset to 0 and 1 binary signals during the next iteration.

In the event that all latches 72, 75, 78 and 81 contain binary 1s, signals are impressed onto conductors AA, BB and CC to operate AND gate 96 to provide a carry out signal to AND gate 120 (FIG. 4D) of all higher-ordered sequencers. If all lower-ordered sequencers of a chained arrangement provide 1 inputs to an AND gate 120 of a higher-ordered sequencer, such gate provides a 1 signal output on its conductor DD to enable gates 97, 103, 108 and 113 in such higher-ordered sequencer to invert, depending upon the conditions as heretofore described.

In most applications, it would be desirable to read control information through the P register to the microcode memory, and the separate outputs of the Q registers will be most ordinarily reserved for test and control purposes. However, it is possible to selectively operate the Q register outputs through the Q out control in FIG. 5B for direct reading and application from the Q registers. Microcode memory may provide signals back to the microcode processor through suitable control logic circuits (not shown) to selectively operate the conditional latch circuit of FIG. 5.

While the forgoing is merely illustrative of the operation of the microcode program sequencer according to the present inventions, it is evident that many variations will be evident to those skilled in the art. Thus, direct loading of any of the P, Q1 or Q2 registers may be accomplished, independantly or simultaniously, by proper selection of control signals from the circuits. Thus, loading of the Q1, Q2 and P registers from memory is accomplished by control signals over the Z, Y and X conductors, respectively, loading incremental addresses is accomplished by control signals on the C, D and W conductors, repsectively, latch storing is accomplished by control signals over the A, B and F conductors, respectively, and transfer from one of the Q1 and Q2 registers to the P register may be accomplished with control signals on one of the S and T conductors, respectively, and on the E conductors.

One feature of the invention resides in a conditional latch circuit shown in FIG. 5, such circuit consists of an OR gate 130 for receiving inputs from AND gates 131, 132, 133 and 134. AND gate 135 receives inputs from terminal 136 and from conductor M and provides inverted outputs to each of AND gates 131, 132 and 133. AND gates 131, 132 and 133 receive second inputs from terminals 137, 138 and 139, respectively. AND gate 135 also provides an output to an input of AND gate 134. OR gate 130 provides an output through drive circuit 141 to terminal 142 and through drive circuit 143 to an input of EXCLUSIVE OR gate 144 and a second input of AND gate 134. EXCLUSIVE OR gate 144 receives a second input from terminal 145 to provide an output to terminal 146.

The conditional latch circuit illustrated in FIG. 5 is conditionally operable as either a latch circuit or an OR gate. AND gate 135 receives inverted clock inputs via conductor M (see FIG. 4A). Hence, AND gate 135 normally receives a 1 input from conductor M, which goes to 0 during a clock input.

If terminal 136 receives a 0 input from microcode memory, an inverted (1) output will be impressed on the lower inputs of AND gates 131, 132 and 133. Hence, if any one of terminals 137, 138 or 139 (or any combination of them) receives an enable input (1), the respective AND gate passes an enable signal to OR gate 130 to impress a signal output on terminal 142. Hence, when terminal 136 is tied to a binary 0 from microcode memory, the circuit illustrated in FIG. 5 operates as an OR gate, and passes a 1 output through drive circuits 141 and 143 if a 1 input appears at one or more of terminals 137, 138 and 139.

EXCLUSIVE OR gate 144 permits inversion of the output from OR gate 130, such that if a signal (binary 1) appears at terminal 145 an inverted output will appear at terminal 146, whereas if a binary 0 appears at terminal 145, gate 144 passes the signal from OR gate 130.

If terminal 136 receives a binary 1 input, AND gate 135 will pass a binary 1 to AND gate 134 and a binary 0 to AND gates 131, 132 and 133 during periods between clock pulses, and will provide binary 0 to AND gate 134 and binary 1 to AND gate 131, 132 and 133 during clock pulses. With a binary 1 at terminal 136, the circuit illustrated in FIG. 5 will operate as a conditional latch circuit. Hence, during a clock pulse when conductor M is 0, a binary 1 will appear at the lower inputs of gates 131, 132 and 113, thereby enabling those gates to pass a signal if a binary 1 appears at a respective terminal 137, 138 or 139. As a result, OR gate 130 will pass a signal to drive circuit 143 to one input of AND gate 134. Upon removal of the clock pulse, the signal on conductor M goes to binary 1, thereby enabling AND gate 134 to feed the output of OR gate 130 back to an input of OR gate 130, thereby operating the circuit as a latch. The latching operation of the circuit shown in FIG. 5 will be terminated during a clock cycle when 0 inputs appear at each of terminals 137, 138 and 139 (since during clock pulses, a binary 0 signal is supplied by AND gate 135 to AND gate 134).

As heretofore described, EXCLUSIVE OR gate 144 can accomplish inversion of the output of OR gate 130, whether the circuit is operated as an OR gate or as a latch. Hence, the inclusion of EXCLUSIVE OR gate 144 adds the further capabilities as an EXCLUSIVE OR gate function.

Terminal 146 of the circuit illustrated in FIG. 5 may be connected to terminal 47 (FIG. 2) of the P control circuit. Since control signals or conductors E may be controlled via inputs on terminal 47, when terminal 47 is connected to terminals 146 jumps and returns as dictated by the contents of the respective Q register may be conditioned by the operation and conditions associated with the circuit shown in FIG. 5, whose input control may be accomplished from microcode memory.

With reference to FIG. 4D, it will be appreciated that the carry outputs from the AND gate 96 (FIG. 4) of each microcode sequencer will input to AND gate 120. Operation of AND gate 120 will provide a signal on conductor DD to cause EXCLUSIVE OR gates 97, 103, 108 and 113 in each microcode sequencer enable the incrementing of the content the P register in the sequencer.

The present invention thus provides a versatile microcode program sequencer capable of selectively operating on addresses to effectuate incrementation, jumps and returns. In this respect, the provision of a plurality of separately controllable registers enables the storing of future address for return or jump purposes in a Q register while operating on addresses in the P register.

This invention is not to be limited by the embodiment shown in the drawings and described in the description, which is given by way of example and not of limitation, but only in accordance with the scope of the appended claims.

What is claimed is:

1. A microcode program sequencer for controlling computer operations in a computer having a microcode memory, comprising, in combination: a first register means having a first input and an output; means connecting said first input of said first register means to said microcode memory to receive address signals from said microcode memory; a first control means connected to said first register means and to said microcode memory and responsive to an instruction signal from said microcode memory for selectively providing a plurality of control signals to said first register means; a second register means having a first and a second input and an output; means connecting said first input of said second register means to said microcode memory to receive said address signals from said microcode memory; means connecting said second input of said second register means to said output of said first register means; a second control means connected to said second register means and to said microcode memory and responsive to an instruction signal from said microcode memory for selectively providing a plurality of control signals to said second register means; each of said first and second register means including
first means responsive to a first control signal from the respective control means for enabling said register means to accept and store address from said microcode memory, and
second means responsive to a second control signal from the respective control means for enabling said register means to provide address signals at its first-named output representative of the address stored therein;
and means connecting said output of said second register means to said microcode memory.

2. Apparatus according to claim 1 wherein said second register includes a second output and a third input; increment means connected to said second output of said second register means for incrementally altering address signals received from said second register means, said increment means having an output connected to said third input of said second register means; said second register means including third means responsive to a third control signal from said second control means for accepting and storing incremental addresses from said increment means, and said second register means including fourth means responsive to a fourth control signal from said second control means for supplying address signals to said second output of said second register means.

3. Apparatus according to claim 2 wherein said first register means includes third means responsive to a third control signal from said first control means for accepting and storing incremental addresses from said increment means.

4. Apparatus according to claim 1 wherein said first and second register means each includes a plurality of storage means, each of said storage means being capable of accepting and storing a bit of an address, said first and second control means each being connected to all of said storage means of the respective register means.

5. Apparatus according to claim 4 wherein each of said storage means of said first and second register means includes OR gate means having first and second inputs and an output, first AND gate means having a first input connected to said microcode memory and a second input connected to the respective control means associated with the respective register means to receive said first control signal, said first AND gate means having an output connected to said first input of said OR gate means, second AND gate means having a first input connected to said output of said OR gate means and having a second input connected to said respective control means to receive said first control signal, said second AND gate means having an output connected to said second input of said OR gate means.

6. Apparatus according to claim 5 wherein each of said OR gate means of each of said storage means of said second register means further includes a third input, each of said storage means of said second register means further including third AND gate means having first and second inputs and an output, said output of said third AND gate means being connected to said third input of said OR gate means; increment means connected to said output of the OR gate means of said second register means for incrementally altering address signal received from the OR gate means of said second register means, said increment means having an output connected to said first input of said third AND gate means, and means connecting said second input of said third AND gate means to said second control means to receive third control signals to enable said storage means of said second register means to accept and store incremented addresses from said increment means.

7. Apparatus according to claim 6 wherein each of said OR gate means of each of said storage means of said first register means includes a third input, each of said storage means of said first register means further including third AND gate means having a first input connected to the output of said increment means, a second input and an output, said output of said third AND gate means being connected to said third input of said OR gate means, and means connecting said second input of said third AND gate means to said first control means to receive third control signals to enable said storage means of said first register means to accept and store incremented addresses from said increment means.

8. Apparatus according to claim 5 wherein each of said OR gate means of each of said storage means of said second register means includes a fourth input, fourth AND gate means having first and second inputs and an output, said output of said fourth AND gate means being connected to said fourth input of said OR gate means, means connecting the output of the OR gate means of each of said storage means of said first register means to respective ones of said first inputs of said fourth AND gate means, and means connecting said second input of said fourth AND gate means to said second control means for receiving fourth control signals to enable said storage means of said second register means to accept and store address signals from the storage means of said first register means.

9. Apparatus according to claim 6 wherein each of said OR gate means of each of said storage means of said second register means includes a fourth input, fourth AND gate means having first and second and an output, said output of said fourth AND gate means being connected to said said fourth input of said OR gate means, means connecting the output of the OR gate means of each of said storage means of said first register means to respective ones of said first inputs of said fourth AND gate means, and means connecting said second input of said fourth AND gate means to said second control means for receiving fourth control signals to enable said storage means of said second register means to accept and store address signals from the storage means of said first register means.

10. Apparatus according to claim 7 wherein each of said OR gate means of each of said storage means of said second register means includes a fourth input, fourth AND gate means having first and second inputs and an output, said output of said fourth AND gate means being connected to said fourth input of said OR gate means, means connecting the output of the OR gate means of each of said storage means of said first register means to respective ones of said first inputs of said fourth AND gate means, and means connecting said second input of said fourth AND gate means to said second input of said fourth AND gate means to said second control means for receiving fourth control signals to enable said storage means of said second register means to accept and store address signals from the storage means of said first register means.

11. Apparatus according to claim 6 wherein said increment means includes a plurality of EXCLUSIVE OR gate means, each of said EXCLUSIVE OR gate means having first and second inputs and an output, the first input of each EXCLUSIVE OR gate means being connected to the output of the OR gate means of the respective storage means of said second register means, the second input of each of said EXCLUSIVE OR gate means being connected to the output of the OR gate means of the next lower ordered storage means of said second register means, and the output of each of said EXCLUSIVE OR gate means being connected to the first input of the respective third AND gate means of said second register means.

12. Apparatus according to claim 7 wherein said increment means includes a plurality of EXCLUSIVE OR gate means, each of said EXCLUSIVE OR gate means having first and second inputs and an output, the first input of each EXCLUSIVE OR gate means being connected to the output of the OR gate means of the respective storage means of said second register means, the second input of each of said EXCLUSIVE OR gate means being connected to the output of the OR gate means of the next lower ordered storage means of said second register means, and the output of each of said EXCLUSIVE OR gate means being connected to the first input of the respective third AND gate means of said second register means.

13. Apparatus according to claim 12 wherein the output of said EXCLUSIVE OR gate means is connected to the first input of the respective third AND gate means of said first register means.

* * * * *